(12) United States Patent
Shin et al.

(10) Patent No.: US 10,720,911 B2
(45) Date of Patent: Jul. 21, 2020

(54) BOOTSTRAP CIRCUIT AND A SAMPLING CIRCUIT USING THE SAME

(71) Applicant: SAMSUNG ELECTRONICS CO., LTD., Suwon-si, Gyeonggi-do (KR)

(72) Inventors: Eun Seok Shin, Seoul (KR); Jung Ho Lee, Anyang-si (KR); Michael Choi, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/521,715

(22) Filed: Jul. 25, 2019

(65) Prior Publication Data

US 2020/0195242 A1 Jun. 18, 2020

(30) Foreign Application Priority Data

Dec. 17, 2018 (KR) .................. 10-2018-0163110

(51) Int. Cl.
| | |
|---|---|
| *H03K 17/16* | (2006.01) |
| *H03K 17/14* | (2006.01) |
| *H02M 3/10* | (2006.01) |
| *G11C 27/02* | (2006.01) |
| *H03K 17/06* | (2006.01) |
| *H02M 3/07* | (2006.01) |

(52) U.S. Cl.
CPC .......... *H03K 17/063* (2013.01); *G11C 27/024* (2013.01); *H02M 3/073* (2013.01); *H02M 2003/076* (2013.01); *H03K 2217/0018* (2013.01)

(58) Field of Classification Search
CPC .... H03K 17/14; H03K 17/145; H03K 17/161; H03K 17/162; H03K 17/56; H03K 17/687; H03K 17/063; H03K 17/01714; H03K 17/01735; H03K 17/01721; H03K 17/01742; H03K 17/017; H03K 2217/0009; H03K 2217/0054; H02M 3/07; H02M 3/10; H02M 3/135; G11C 27/02; G11C 27/024
See application file for complete search history.

(56) References Cited

U.S. PATENT DOCUMENTS

| | | | |
|---|---|---|---|
| 6,215,348 B1 | 4/2001 | Steensgaard-Madsen | |
| 6,323,697 B1 * | 11/2001 | Pavan | ................. G11C 27/024 327/91 |
| 6,356,469 B1 | 3/2002 | Roohparvar et al. | |
| 6,563,447 B1 | 5/2003 | Schofield | |
| 6,661,682 B2 | 12/2003 | Kim et al. | |
| 7,049,877 B2 * | 5/2006 | Clara | ..................... G11C 27/02 327/333 |
| 8,222,948 B2 | 7/2012 | Birk | |
| 8,415,985 B2 | 4/2013 | Cheeranthodi | |

(Continued)

*Primary Examiner* — An T Luu
(74) *Attorney, Agent, or Firm* — F. Chau & Associates, LLC

(57) ABSTRACT

A bootstrap circuit including: a charge pump; a power unit including a bootstrap capacitor, wherein the bootstrap capacitor is charged using an output voltage of the charge pump; and a switch driver for generating a bootstrap signal based on a clock signal and an analog signal, wherein the analog signal is input to an analog switch, the switch driver for controlling the analog switch using the bootstrap signal, and including a first body switch connected between an input terminal and a body of the analog switch.

20 Claims, 9 Drawing Sheets

(56) References Cited

U.S. PATENT DOCUMENTS

| | | |
|---|---|---|
| 9,172,364 B2 | 10/2015 | Trampitsch |
| 9,379,702 B2 * | 6/2016 | Yang ................. H03K 17/6871 |
| 2006/0192546 A1 | 8/2006 | Geelen |
| 2013/0249607 A1 | 9/2013 | Park et al. |

* cited by examiner

BOOTSTRAP CIRCUIT AND A SAMPLING CIRCUIT USING THE SAME

CROSS-REFERENCE TO RELATED APPLICATION(S)

This application claims priority under 35 U.S.C. § 119 to Korean Patent Application No. 10-2018-0163110 filed on Dec. 17, 2018 in the Korean Intellectual Property Office, the disclosure of which is incorporated by reference herein in its entirety.

TECHNICAL FIELD

The present inventive concept relates to a bootstrap circuit and a sampling circuit using the same.

DESCRIPTION OF RELATED ART

An analog switch is used in a variety of analog circuits such as an analog multiplexer, a sample and hold amplifier (SHA), and the like. In order to process a high-resolution analog signal, a high-linearity analog switch is used.

A bootstrap circuit is used to improve the linearity of an analog switch. For example, an n-type metal oxide semiconductor (NMOS) transistor for an analog switch may have its gate-source voltage kept constant by a bootstrap circuit to reduce a change in on-resistance, thereby improving linearity of the NMOS transistor. However, as a swing width of an analog signal increases, a body effect of an analog switch is increased. In this case, there is a limit to how much the linearity of the analog switch can be increased by just keeping the gate-source voltage constant. Moreover, in a multi-channel sampling circuit, a bootstrap circuit is required due to the number of analog switches for multiplexing and sampling. Therefore, a size and power consumption of the entire circuit may be increased.

SUMMARY

According to an exemplary embodiment of the present inventive concept, a bootstrap circuit includes: a charge pump; a power unit including a bootstrap capacitor, wherein the bootstrap capacitor is charged using an output voltage of the charge pump; and a switch driver for generating a bootstrap signal based on a clock signal and an analog signal, wherein the analog signal is input to an analog switch, the switch driver for controlling the analog switch using the bootstrap signal, and including a first body switch connected between an input terminal and a body of the analog switch.

According to an exemplary embodiment of the present inventive concept, a bootstrap circuit includes: a power unit including a bootstrap capacitor, wherein the power unit charges the bootstrap capacitor using an output voltage of a charge pump; and a switch driver for supplying a voltage charged in the bootstrap capacitor to an analog switch in response to a clock signal and a channel selection signal, and including a first body switch connected between an input terminal and a body of the analog switch.

According to an exemplary embodiment of the present inventive concept, a sampling circuit includes: a plurality of analog switches for sampling a plurality of analog signals; and a bootstrap circuit connected to each of the plurality of analog switches, wherein a first bootstrap circuit of the bootstrap circuits includes: a power unit including a bootstrap capacitor, wherein the power unit charges the bootstrap capacitor using an output voltage of a charge pump; and a switch driver for supplying a voltage charged in the bootstrap capacitor to a first analog switch of the analog switches in response to a clock signal and a channel selection signal, and including a first body switch connected between an input terminal and a body of the first analog switch.

According to an exemplary embodiment of the present inventive concept, a bootstrap circuit includes a charge pump, a power unit including first and second switches connected to an output terminal of the charge pump, and a bootstrap capacitor connected between the first switch and the second switch, and a switch driver including a first switch connected between a first node of the bootstrap capacitor and a control terminal of an analog switch, a second switch connected between a second node of the bootstrap capacitor and an input terminal of the analog switch, and a first body switch connected between the input terminal and a body of the analog switch.

According to an exemplary embodiment of the present inventive concept, a bootstrap circuit includes a charge pump, a power unit including first and second switches connected to an output terminal of the charge pump, and a bootstrap capacitor connected between the first switch and the second switch, and a switch driver including first and second switches connected in series between a first node of the bootstrap capacitor and a control terminal of an analog switch, third and fourth switches connected in series between a second node of the bootstrap capacitor and an input terminal of the analog switch, and a first body switch connected between the input terminal and a body of the analog switch.

According to an exemplary embodiment of the present inventive concept, a bootstrap circuit includes a power unit including a bootstrap capacitor; and a switch driver that is connected to receive an output of the power unit or that is blocked from receiving the output of the power unit by a first plurality of switches, the switch driver including an analog switch and a body switch connected to a body and an input terminal of the analog switch.

BRIEF DESCRIPTION OF THE DRAWINGS

The above and other features of the present inventive concept will be more clearly understood by describing in detail exemplary embodiments thereof with reference to the accompanying drawings, in which.

DETAILED DESCRIPTION OF THE EMBODIMENTS

Figure 1:
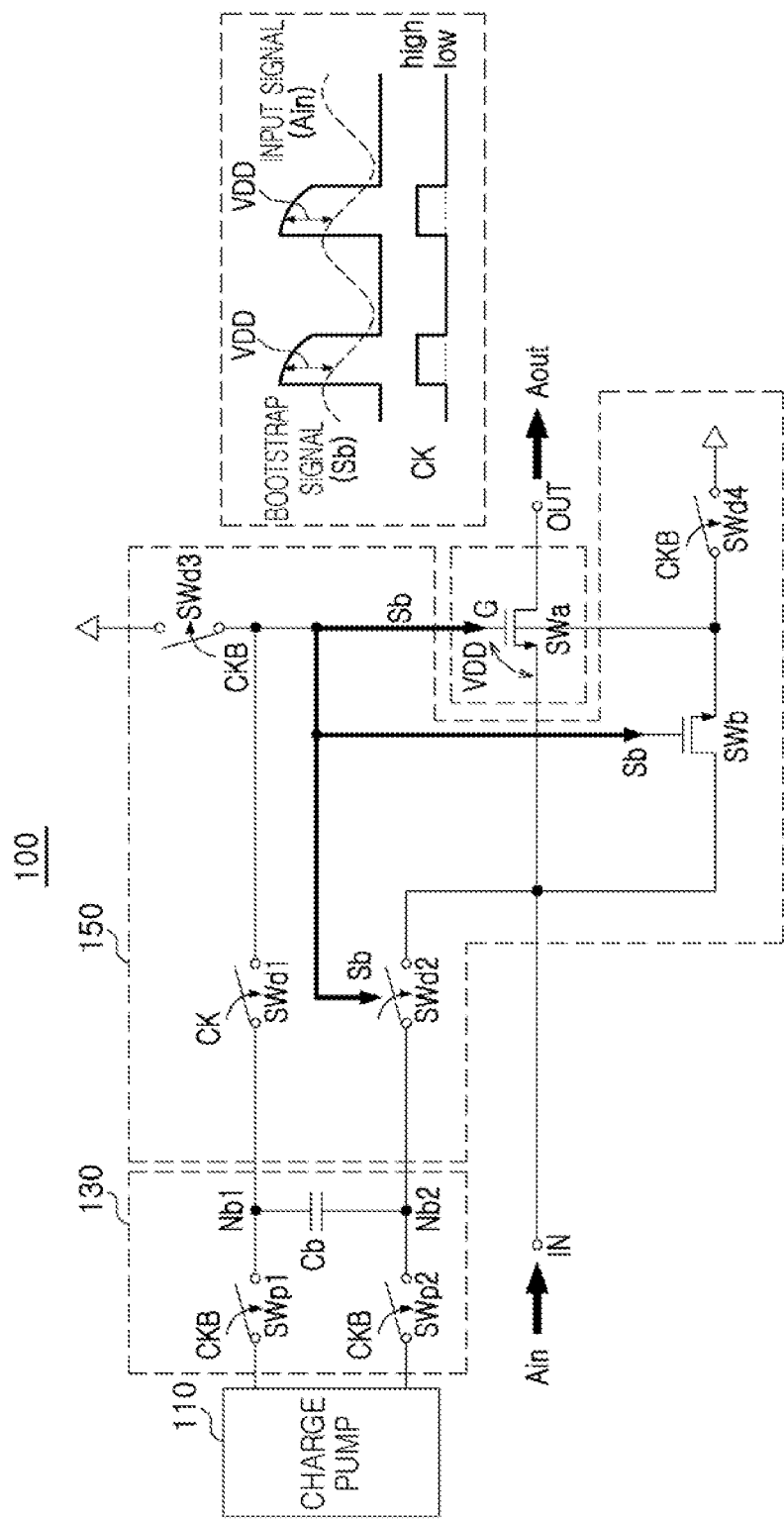
FIG. 1 is a circuit diagram illustrating a bootstrap circuit according to an exemplary embodiment of the present inventive concept.

Hereinafter, exemplary embodiments of the present inventive concept will be described in detail with reference to the attached drawings. The same reference numerals may be used for the same constituent elements in the drawings, and thus, duplicate descriptions of the same constituent elements may be omitted.

Figure 2:
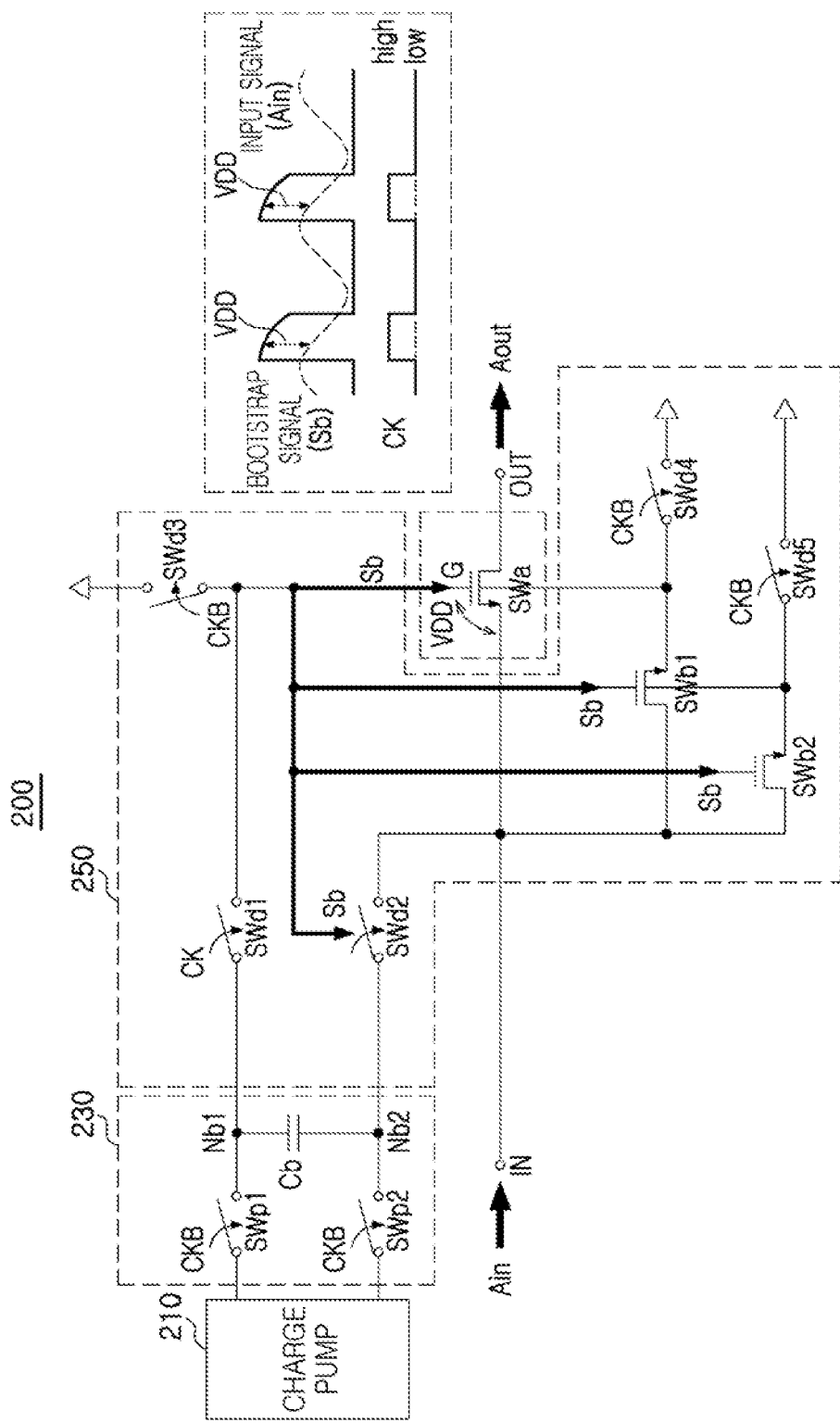
FIG. 2 is a circuit diagram illustrating a bootstrap circuit according to an exemplary embodiment of the present inventive concept.

FIGS. 1 and 2 are circuit diagrams illustrating a bootstrap circuit according to an exemplary embodiment of the present inventive concept.

Referring to FIG. 1, a bootstrap circuit 100 may include a charge pump 110, a power unit 130, and a switch driver 150.

The charge pump 110 pumps an input voltage using a clock signal CK having a constant cycle, thereby generating an output voltage $V_{DD}$ having a constant magnitude.

The power unit 130 may supply an output voltage, generated by the charge pump 110, to an analog switch SWa through the switch driver 150.

The power unit 130 may include a first switch SWp1 and a second switch SWp2, controlled by an inverted clock signal CKB, and a bootstrap capacitor Cb.

The bootstrap capacitor Cb may be connected to the charge pump 110 through the first switch SWp1 and the second switch SWp2, and may be charged with a constant voltage $V_{DD}$. The bootstrap capacitor Cb may supply the constant voltage $V_{DD}$ to the analog switch SWa under the control of the switch driver 150. In other words, the bootstrap capacitor Cb may apply the constant voltage $V_{DD}$ between an input terminal IN and a control terminal G of the analog switch SWa regardless of the amplitude of the analog signal Ain.

The switch driver 150 may include a first switch SWd1 operated according to a clock signal CK, a second switch SWd2 operated according to a bootstrap signal Sb. The switch driver 150 may further include a third switch SWd3 and a fourth switch SWd4, operated according to an inverted clock signal CKB, and a body switch SWb operated according to the bootstrap signal Sb. The bootstrap signal Sb may be a switch control signal in which the constant voltage $V_{DD}$ is added to the analog signal Ain, which is input to the input terminal IN of the analog switch SWa, in accordance with an on-phase of the clock signal CK. For example, when the clock signal CK is in the on-phase, the constant voltage $V_{DD}$ is added to the analog signal Ain to produce the bootstrap signal Sb.

In the on-phase of the first switch SWd1 and the second switch SWd2, the analog switch SWa may be turned on by applying the constant voltage $V_{DD}$ between the control terminal G and the input terminal IN. The on-phase of the first switch SWd1 and the second switch SWd2 may correspond to when the first switch SWd1 and the second switch SWd2 are closed.

The third switch SWd3 may be connected between a ground GND and the control terminal G of the analog switch SWa. The third switch SWd3 may be used as a control terminal grounding device of the analog switch SWa. In the on-phase of the third switch SWd3, the analog switch SWa may be turned off by connecting the ground GND to the control terminal G. The on-phase of the third switch SWd3 may correspond to when the third switch SWd3 is closed.

The fourth switch SWd4 may be connected between a ground GND and a body of the analog switch SWa. The fourth switch SWd4 may be used as a body grounding device of the analog switch SWa.

The body switch SWb may be connected between the body of the analog switch SWa and the input terminal IN. The body switch SWb may be operated synchronously with the analog switch SWa according to the bootstrap signal Sb. The body switch SWb short-circuits a body of the analog switch SWa and the input terminal IN in the on-phase of the body switch SWb, thereby removing a body effect of the analog switch SWa.

The bootstrap circuit 100 of the present inventive concept includes the body switch SWb, thereby optimizing an on-resistance of the analog switch SWa according to a frequency of the analog input signal Ain. For example, the bootstrap circuit 100 may control the on-resistance of the body switch SWb, to match a time constant based on the on-resistance of the body switch SWb and a parasitic capacitance of the analog switch SWa with a frequency of the analog signal Ain.

In FIG. 1, it is noted that the analog switch SWa and the body switch SWb are an n-type metal oxide semiconductor (NMOS) transistor, but the present inventive concept is not limited thereto. For example, each of the analog switch SWa and the body switch SWb may be a p-type metal oxide semiconductor (PMOS) transistor.

The bootstrap circuit 100 may further include one or more body switches in order to remove a body effect of the body switch SWb itself. An example of a bootstrap circuit including two body switches is illustrated in FIG. 2.

Referring to FIG. 2, a bootstrap circuit 200 may include a charge pump 210, a power unit 230, and a switch driver 250.

In a manner different from the bootstrap circuit 100 of FIG. 1, the switch driver 250 may include a first body switch SWb1 and a second body switch SWb2.

The first body switch SWb1 may be connected between the body of the analog switch SWa and the input terminal IN. The first body switch SWb1 may be operated synchronously with the analog switch SWa according to the bootstrap signal Sb. The first body switch SWb1 short-circuits the body of the analog switch SWa and the input terminal IN in the on-phase of the first body switch SWb1, thereby removing a body effect of the analog switch SWa.

The second body switch SWb2 may be connected between a body of the first body switch SWb1 and the input terminal IN. The second body switch SWb2 may be operated synchronously with the first body switch SWb1 according to the bootstrap signal Sb. The second body switch SWb2 short-circuits the body of the first body switch SWb1 and the input terminal IN in the on-phase of the second body switch SWb2, thereby removing a body effect of the first body switch SWb1. The switch driver 250 of FIG. 2 further includes a fifth switch SWd5 connected between a ground GND and the second body switch SWb2. The fifth switch SWd5 may operate in response to an inverted clock signal CKB.

Figure 3:
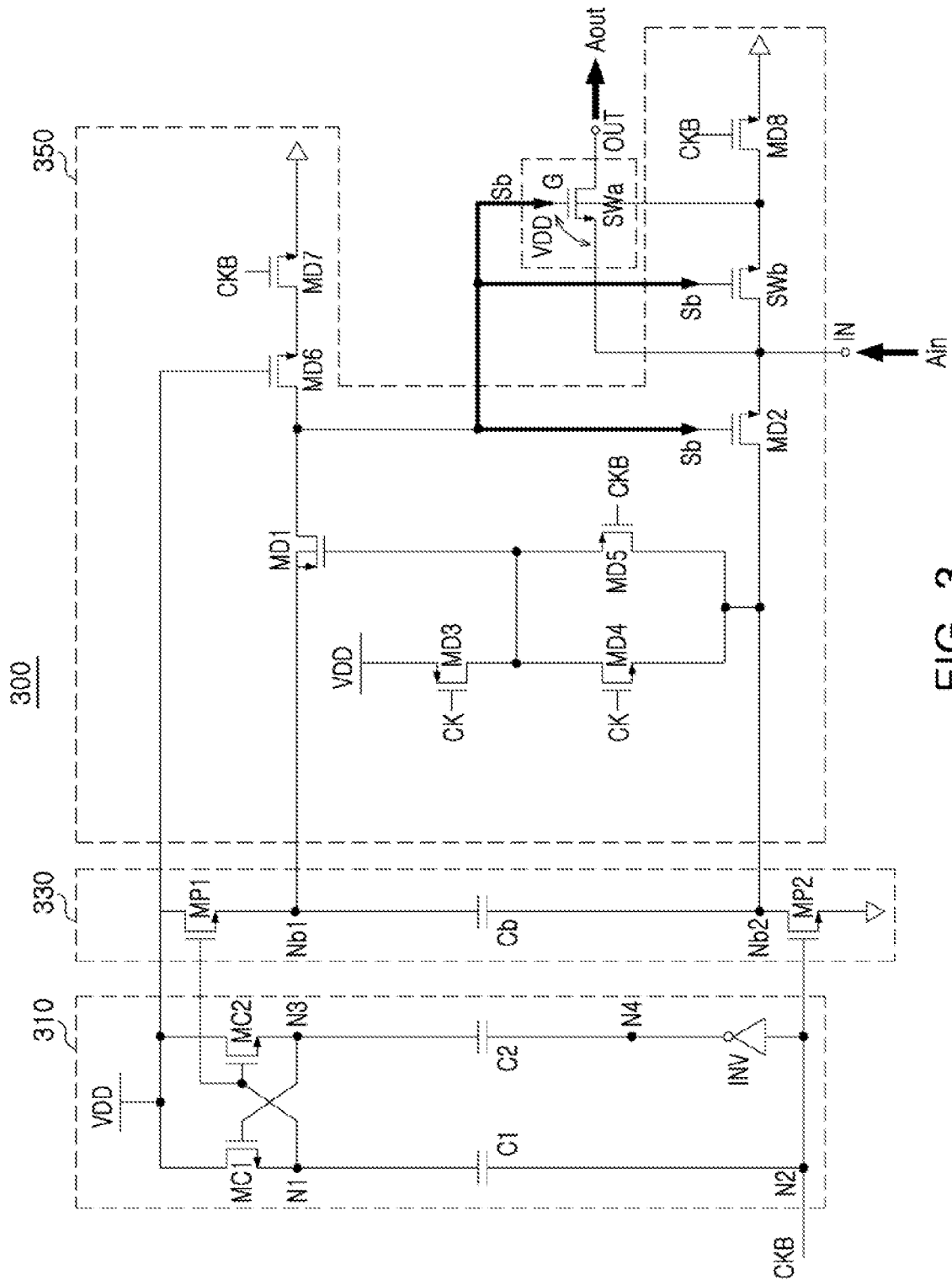
FIG. 3 is a circuit diagram illustrating an example of the bootstrap circuit of FIG. 1.
Figure 4:
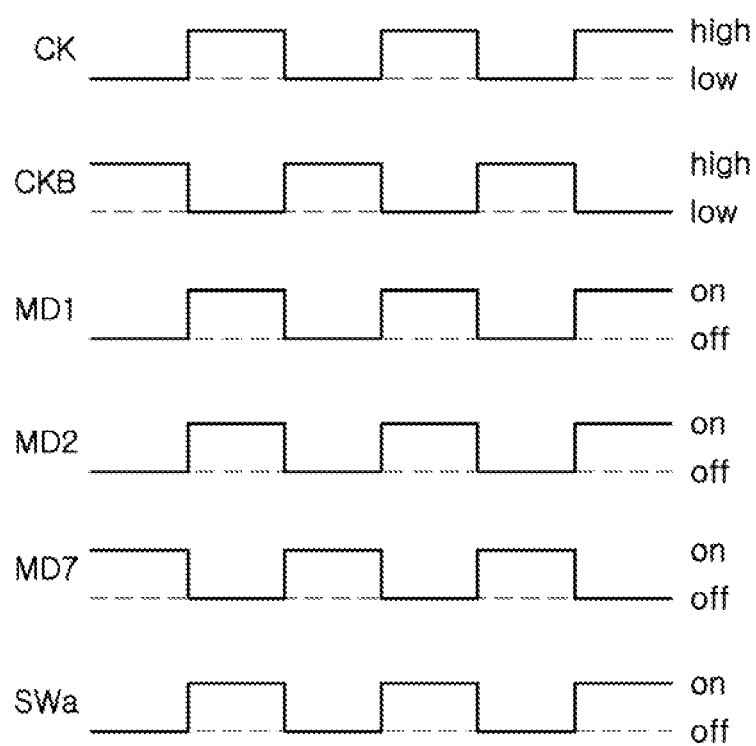
FIG. 4 is a drawing illustrating an operation waveform of the bootstrap circuit of FIG. 3.

FIG. 3 is a circuit diagram illustrating an example of the bootstrap circuit of FIG. 1, and FIG. 4 is a drawing illustrating an operation waveform of the bootstrap circuit of FIG. 3.

Referring to FIG. 3, a bootstrap circuit 300 may include a charge pump 310, a power unit 330, and a switch driver 350.

The charge pump 310 may include a first transistor MC1, a second transistor MC2, a first capacitor C1, a second capacitor C2, and an inverter INV.

In the first transistor MC1, a drain is connected to a power voltage $V_{DD}$, a source is connected to a first node N1 of the first capacitor C1, and a gate is connected to a source of the second transistor MC2. In the second transistor MC2, a drain is connected to the power voltage $V_{DD}$, a source is connected to a first node N3 of the second capacitor C2, and a gate is connected to the source of the first transistor MC1. In the present embodiment, the first transistor MC1 and the second transistor MC2 may be an NMOS transistor.

The first node N1 of the first capacitor C1 is connected to the source of the first transistor MC1, and an inverted clock signal CKB may be input to a second node N2 of the first capacitor C1. The first node N3 of the second capacitor C2 is connected to the source of the second transistor MC2, and a clock signal CK may be input to a second node N4 of the second capacitor C2 through the inverter INV.

The power unit 330 may include a first transistor MP1 and a second transistor MP2, operated according to the inverted clock signal CKB, and a bootstrap capacitor Cb.

In the first transistor MP1, a drain is connected to a power voltage $V_{DD}$ of the charge pump, and a source is connected to a first node Nb1 of the bootstrap capacitor Cb. In the second transistor MP2, a drain is connected to a second node Nb2 of the bootstrap capacitor Cb, and a source is connected to a ground GND. In the present embodiment, the first transistor MP1 and the second transistor MP2 may be an NMOS transistor.

The bootstrap capacitor Cb may be connected to the charge pump 310 through the first transistor MP1 and the second transistor MP2, and may be charged with a constant voltage $V_{DD}$. The bootstrap capacitor Cb may supply the constant voltage $V_{DD}$ to the analog switch SWa under the control of the switch driver 350.

The switch driver 350 may include first, second, third, fourth, fifth, sixth, seventh and eighth transistors MD1, MD2, MD3, MD4, MD5, MD6, MD7 and MD8, and a body switch SWb. In an exemplary embodiment of the present inventive concept, the first, third, and fifth transistors MD1, MD3 and MD5 may be PMOS transistors, while the second, fourth, and sixth to eighth transistors MD2, MD4 and MD6-MD8 may be NMOS transistors.

In the first transistor MD1, a source is connected to the source of the first transistor MP1 of the power unit 330, a drain is connected to a drain of the sixth transistor MD6, and a gate is connected to a drain of the third transistor MD3.

In the second transistor MD2, a drain is connected to the drain of the second transistor MP2 of the power unit 330, a source is connected to a source of the analog switch SWa, and a bootstrap signal Sb may be input to a gate.

In the third transistor MD3, a source is connected to a power voltage $V_{DD}$, and the drain is connected to a drain of the fourth transistor MD4.

In the fourth transistor MD4, the drain is connected to the drain of the third transistor MD3, and a source is connected to the drain of the second transistor MP2 of the power unit 330.

In the fifth transistor MD5, a source is connected to the drain of the third transistor MD3, and a drain is connected to the drain of the second transistor MP2 of the power unit 330.

The third transistor MD3 and the fourth transistor MD4 may be turned on/off according to a clock signal CK, input to each gate thereof. The fifth transistor MD5 may be turned on/off according to an inverted clock signal CKB, input to a gate thereof. The third transistor MD3 and the fourth and fifth transistors MD4 and MD5 may be operated alternately with each other.

The first transistor MD1 may be turned on/off according to an alternating operation of the third transistor MD3 and the fourth and fifth transistors MD4 and MD5.

When the clock signal CK has a high logic value, the fourth transistor MD4 and the fifth transistor MD5 are turned-on and a source-gate voltage of the first transistor MD1 is maintained at $V_{DD}$, so that the first transistor MD1 may be turned on.

When the clock signal CK has a low logic value, the third transistor MD3 is turned-on and the source-gate voltage of the first transistor MD1 is lower than a threshold voltage; therefore, the first transistor MD 1 may be turned off.

In the sixth transistor MD6, the drain is connected to the drain of the first transistor MD1, a source is connected to a drain of the seventh transistor MD7, and a gate is connected to a power voltage $V_{DD}$. In the seventh transistor MD7, the drain is connected to the source of the sixth transistor MD6, a source is connected to the ground GND, and an inverted clock signal CKB is input to a gate.

The sixth transistor MD6 and the seventh transistor MD7 are connected in series between the ground GND and a control terminal G of the analog switch SWa, and may be used as a control terminal grounding device of the analog switch SWa.

In the eighth transistor MD8, a drain is connected to a body of the analog switch SWa, a source is connected to the ground GND, and an inverted clock signal CKB is input to a gate.

The analog switch SWa may sample the analog signal Ain according to the bootstrap signal Sb, input to the control terminal G of the analog switch SWa, and output the analog signal to the output terminal OUT of the analog switch SWa as Aout.

In the body switch SWb, a source is connected to a body of the analog switch SWa, a drain is connected to the source of the second transistor MD2, and a bootstrap signal Sb may be input to a gate. The body switch SWb may be operated synchronously with the analog switch SWa according to the bootstrap signal Sb. The body switch SWb short-circuits the body of the analog switch SWa and the input terminal IN in the on-phase of the analog switch SWa, thereby removing a body effect of the analog switch SWa.

The bootstrap circuit 300 includes the body switch SWb. Thus, the bootstrap circuit 300 is capable of optimizing on-resistance of itself including the analog switch SWa. Thus, even when a swing width of the analog input signal Ain is great, linearity of the analog switch SWa may be improved.

Hereinafter, an operation of the bootstrap circuit 300 will be described in detail with reference to the operation waveform of FIG. 4.

As a cycle of the clock signal CK is repeated, the bootstrap capacitor Cb may be charged with $V_{DD}$ by the charge pump 310.

When the clock signal CK is a high logic value, the connection of the bootstrap capacitor Cb with the charge pump 310 is blocked and the bootstrap capacitor Cb is connected to the switch driver 350. In other words, the bootstrap capacitor Cb is disconnected from the charge pump 310.

When the clock signal CK is a high logic value, the first transistor MD1 and the second transistor MD2 are turned-on, and a voltage between the input terminal IN and the control terminal G of the analog switch SWa is maintained at the constant voltage $V_{DD}$, so that the analog switch SWa is turned-on. Moreover, the body switch SWb is turned-on along with the analog switch SWa, thereby short-circuiting the body of the analog switch SWa and the input terminal IN.

When the clock signal CK has a low logic value, the connection of the bootstrap capacitor Cb with the switch driver 350 is blocked and the bootstrap capacitor is connected to the charge pump 310. In other words, the bootstrap capacitor Cb is disconnected from the switch driver 350. Since the first transistor MD1 is turned-off and the seventh transistor MD7 is turned-on, the ground GND is connected to a gate and the analog switch SWa is turned-off. Moreover, since the eighth transistor MD8 is turned-on, the body of the analog switch SWa is connected to the ground GND.

Figure 5:
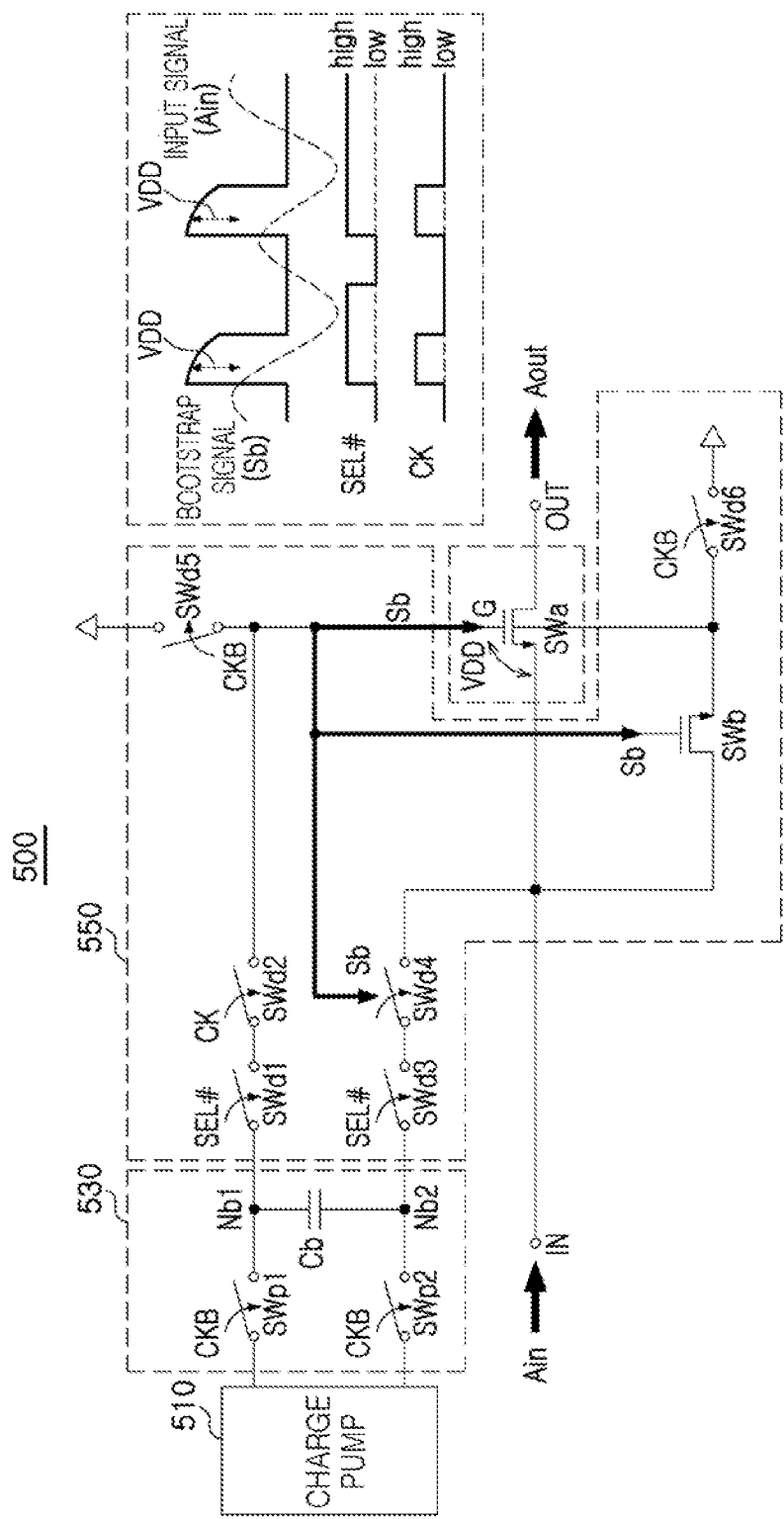
FIG. 5 is a circuit diagram illustrating a bootstrap circuit according to an exemplary embodiment of the present inventive concept.

FIG. 5 is a circuit diagram illustrating a bootstrap circuit according to an exemplary embodiment of the present inventive concept.

Referring to FIG. 5, a bootstrap circuit 500 may include a charge pump 510, a power unit 530, and a switch driver 550.

The charge pump 510 pumps an input voltage using a clock signal CK having a constant cycle, thereby generating an output voltage $V_{DD}$ having a constant magnitude.

The power unit 530 may supply the output voltage $V_{DD}$, generated by the charge pump 510, to an analog switch SWa under the control of the switch driver 550.

The power unit 530 may include a first switch SWp1 and a second switch SWp2, operated according to the inverted clock signal CKB, and a bootstrap capacitor Cb.

The bootstrap capacitor Cb may be connected to the charge pump 510 through the first switch SWp1 and the second switch SWp2, and may be charged with a constant voltage $V_{DD}$. The bootstrap capacitor Cb may supply the constant voltage $V_Lw$ to the analog switch SWa under the control of the switch driver 550. In other words, the bootstrap capacitor Cb may apply the constant voltage $V_{DD}$ between an input terminal IN and a control terminal G of the analog switch SWa regardless of the amplitude of the analog signal Ain.

The switch driver 550 may include first, second, third, fourth, fifth and sixth switches SWd1, SWd2, SWd3, SWd4, SWd5 and SWd6, and a body switch SWb.

The first switch SWd1 and the third switch SWd3 may be operated according to a channel selection signal SEL #. The second switch SWd2 may be operated according to the clock signal CK. The fourth switch SWd4 and the body switch SWb may be operated according to the bootstrap signal Sb. The fifth switch SWd5 may be operated according to the inverted clock signal CKB.

The channel selection signal SEL # may be a signal for selecting a signal of a specific channel among multi-channel input signals.

The bootstrap circuit 500 may perform a multiplexing function, through the first switch SWd1 and the third switch SWd3, operated according to the channel selection signal SEL #.

The bootstrap signal Sb may be generated based on the clock signal CK and the analog signal Ain, input to the input terminal IN of the analog switch SWa. For example, the bootstrap signal Sb may be a switch control signal in which the constant voltage $V_{DD}$ is added to the analog signal Ain, which is input to the input terminal IN of the analog switch SWa, in accordance with the on-phase of the channel selection signal SEL # and the clock signal CK. For example, in the on-phase of the channel selection signal SEL # and the clock signal CK, the constant voltage $V_{DD}$ is added to the analog signal Ain to produce the bootstrap signal Sb.

The charge pump 510 and the power unit 530 may be functionally separated from the switch driver 550 by the first switch SWd1 and the third switch SWd3 of the switch driver 550. The charge pump 510 and the power unit 530 are continuously operated while being separated from the switch driver 550, thereby charging the bootstrap capacitor Cb with the constant voltage $V_{DD}$. Thus, when a particular channel is repeatedly selected, the bootstrap circuit 500 may supply the constant voltage $V_{DD}$, charged in the bootstrap capacitor Cb, to the analog switch SWa without an additional pumping time.

The analog switch SWa may sample the analog signal Ain according to the bootstrap signal Sb, and output the analog signal to the output terminal OUT of the analog switch SWa as Aout.

In the on-phase of the first to fourth switches SWd1 to SWd4, a voltage between the input terminal IN and the control terminal G of the analog switch SWa is maintained at the constant voltage $V_{DD}$, so that the analog switch SWa may be turned on.

The fifth switch SWd5 may be connected between a ground GND and the control terminal G of the analog switch SWa. The fifth switch SWd5 may be used as a control terminal grounding device of the analog switch SWa. In the on-phase of the fifth switch SWd5, the analog switch SWa may be turned off by connecting the ground GND to the control terminal G.

The sixth switch SWd6 may be connected between a ground GND and a body of the analog switch SWa. The sixth switch SWd6 may be used as a body grounding device of the analog switch SWa.

The body switch SWb may be connected between the body of the analog switch SWa and the input terminal IN. The body switch SWb may be operated synchronously with the analog switch SWa by the bootstrap signal Sb. The body switch SWb short-circuits the body of the analog switch SWa and the input terminal IN in the on-phase, thereby removing a body effect of the analog switch SWa.

The bootstrap circuit 500 includes the body switch SWb, thereby optimizing an on-resistance of the analog switch SWa according to a frequency of the analog input signal Ain. For example, the bootstrap circuit 500 may control the on-resistance of the body switch SWb, to match a time constant based on the on-resistance of the body switch SWb and a parasitic capacitance of the analog switch SWa with a frequency of the analog signal Ain. Therefore, even when a swing width of the analog input signal Ain is great, linearity of the analog switch SWa may be further improved.

In FIG. 5, it is noted that the analog switch SWa and the body switch SWb are an NMOS transistor, but the present invention concept is not limited thereto. For example, each of the analog switch SWa and the body switch SWb may be a PMOS transistor.

The bootstrap circuit 500 may further include one or more body switches in order to remove a body effect of a body switch itself. An example of a bootstrap circuit including two body switches is as illustrated in FIG. 6.

Figure 6:
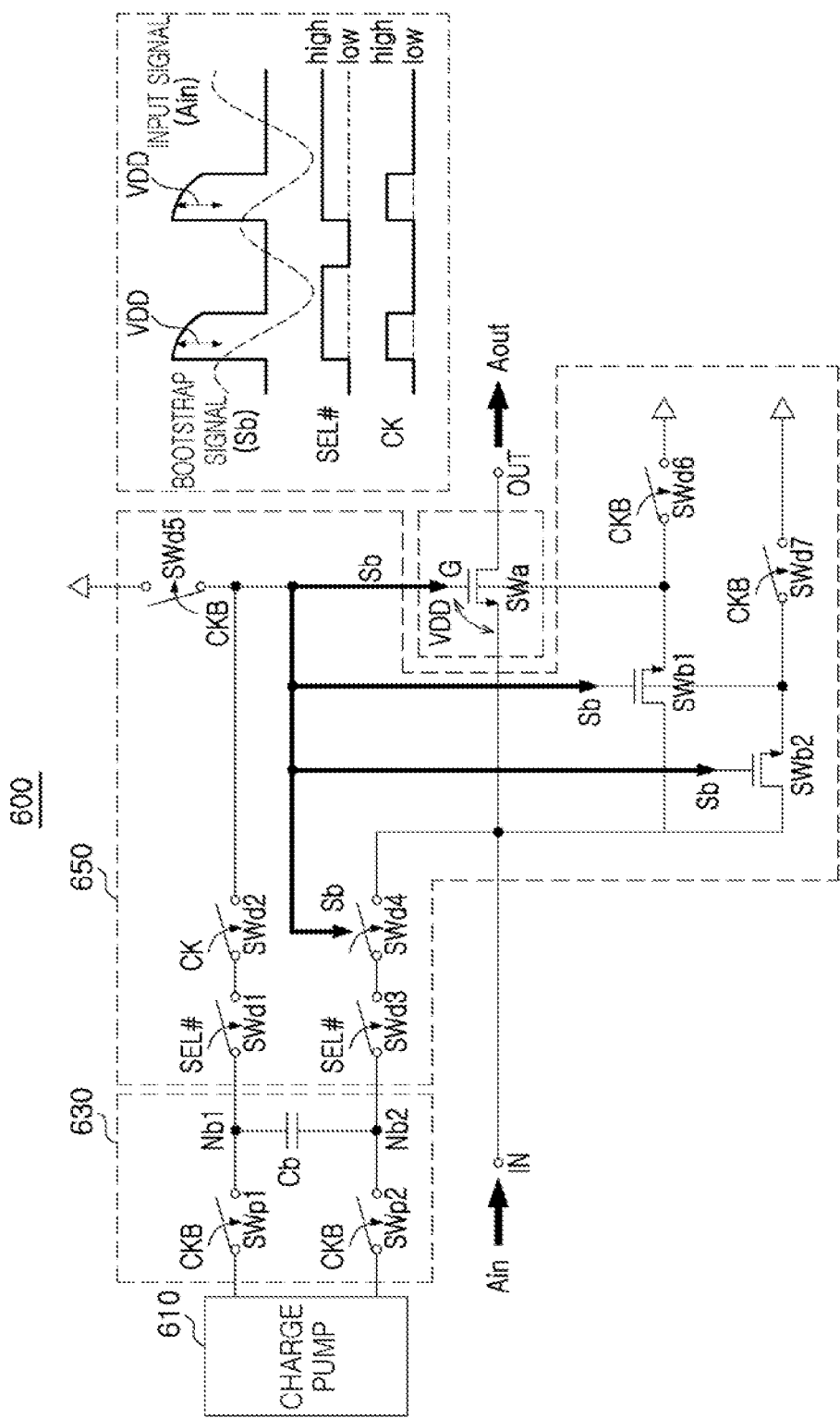
FIG. 6 is a circuit diagram illustrating a bootstrap circuit according to an exemplary embodiment of the present inventive concept.

Referring to FIG. 6, a bootstrap circuit 600 may include a charge pump 610, a power unit 630, and a switch driver 650.

In a manner different from the bootstrap circuit 500 of FIG. 5, the switch driver 650 may include a first body switch SWb1 and a second body switch SWb2.

The first body switch SWb1 may be connected between the body of the analog switch SWa and the input terminal IN. The first body switch SWb1 may be operated synchronously with the analog switch SWa according to the bootstrap signal Sb. The first body switch SWb1 short-circuits the body of the analog switch SWa and the input terminal IN in the on-phase of the first body switch SWb1, thereby removing a body effect of the analog switch SWa.

The second body switch SWb2 may be connected between a body of the first body switch SWb1 and the input terminal IN. The second body switch SWb2 may be operated synchronously with the first body switch SWb1 according to the bootstrap signal Sb. The second body switch SWb2 short-circuits the body of the first body switch SWb1 and the input terminal IN in the on-phase of the second body switch SWb2, thereby removing a body effect of the first body switch SWb1.

Figure 7:
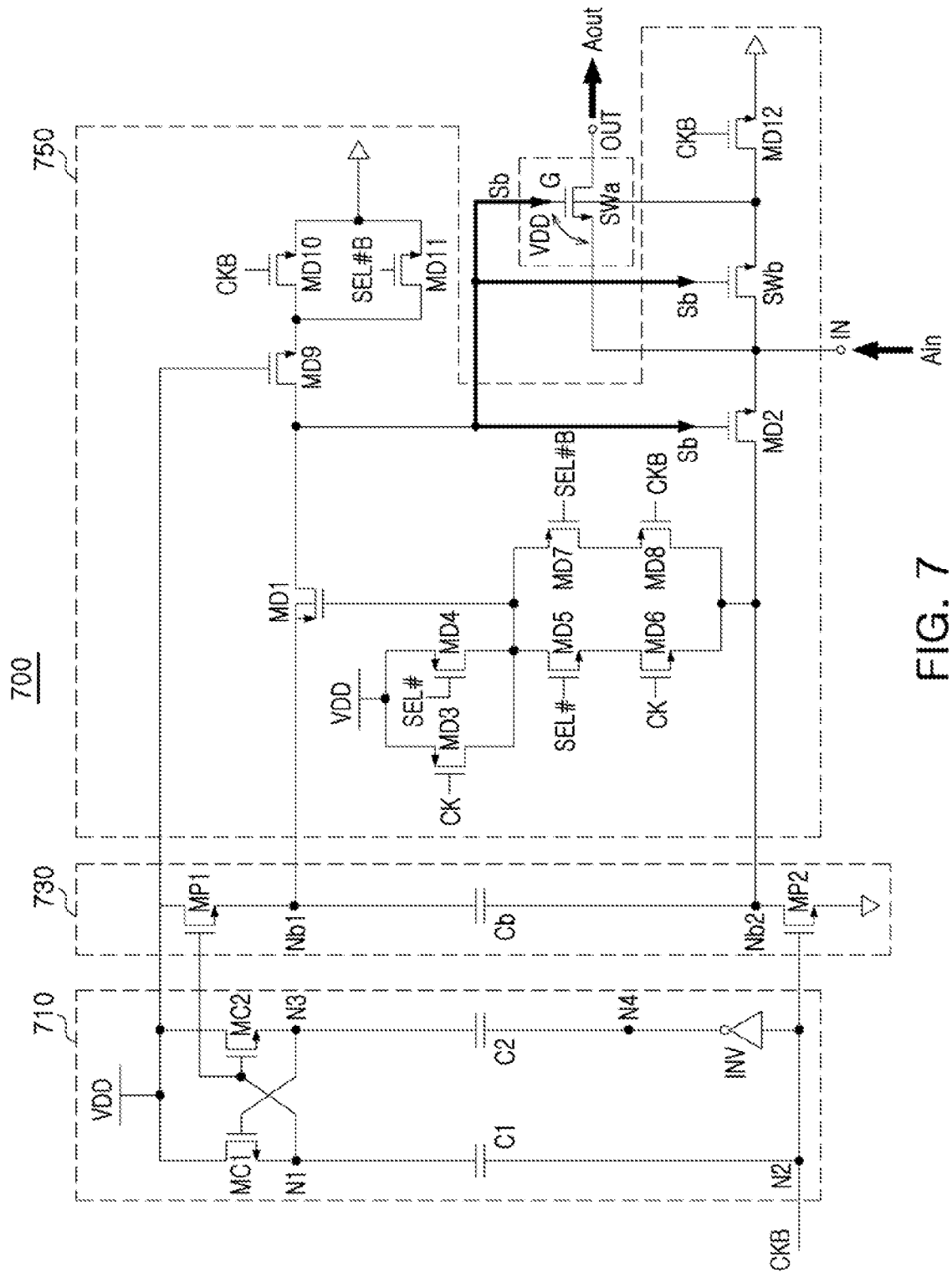
FIG. 7 is a circuit diagram illustrating an example of the bootstrap circuit of FIG. 5.
Figure 8:
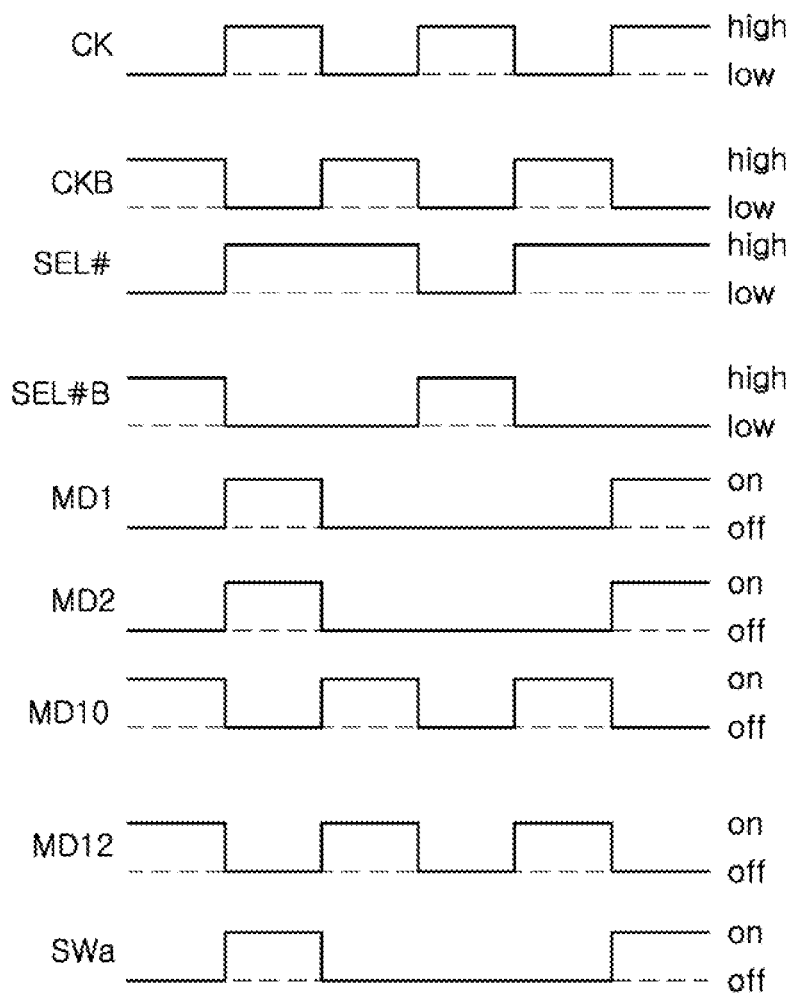
FIG. 8 is a drawing illustrating an operation waveform of the bootstrap circuit of FIG. 7.

FIG. 7 is a circuit diagram illustrating an example of the bootstrap circuit of FIG. 5, and FIG. 8 is a drawing illustrating an operation waveform of the bootstrap circuit of FIG. 7.

Referring to FIG. 7, a bootstrap circuit 700 may include a charge pump 710, a power unit 730, and a switch driver 750.

The charge pump 710 may include a first transistor MC1, a second transistor MC2, a first capacitor C1, a second capacitor C2, and an inverter INV.

In the first transistor MC1, a drain is connected to a power voltage $V_{DD}$, a source is connected to a first node N1 of the first capacitor C1, and a gate is connected to a source of the second transistor MC2. In the second transistor MC2, a drain is connected to the power voltage $V_{DD}$, the source is connected to a first node N3 of a second capacitor C2, and a gate is connected to the source of the first transistor MC1. In an exemplary embodiment of the present inventive concept, the first transistor MC1 and the second transistor MC2 may be an NMOS transistor.

The first node N1 of the first capacitor C1 is connected to the source of the first transistor MC1, and an inverted clock signal CKB may be input to a second node N2 of the first capacitor C1. The first node N3 of the second capacitor C2 is connected to the source of the second transistor MC2, and a clock signal CK may be input to a second node N4 of the second capacitor C2 through the inverter INV.

The power unit 730 may include a first transistor MP1 and a second transistor MP2, operated according to the inverted clock signal CKB, and a bootstrap capacitor Cb.

In the first transistor MP1, a drain is connected to a power voltage $V_{DD}$, and a source is connected to a first node Nb1 of the bootstrap capacitor Cb. In the second transistor MP2, a drain is connected to a second node Nb2 of the bootstrap capacitor Cb, and a source is connected to a ground GND. The first transistor MP1 and the second transistor MP2 may be turned on/off according to an inverted clock signal CKB, input to each gate thereof.

The bootstrap capacitor Cb may be charged with a constant voltage $V_{DD}$ using an output voltage of the charge pump 710 connected through the first transistor MP1 and the second transistor MP2. The bootstrap capacitor Cb may supply the constant voltage $V_{DD}$ to the analog switch SWa under the control of the switch driver 750.

The switch driver 750 may include first, second, third, fourth, fifth, sixth, seventh, eighth, ninth, tenth, eleventh and twelfth transistors MD1, MD2, MD3, MD4, MD5, MD6, MD7, MD8, MD9, MD10, MD11 and MD12, and a body switch SWb. In an exemplary embodiment of the present inventive concept, the first, third, fourth, seventh, and eighth transistors MD1, MD3, MD4, MD7 and MD8 are PMOS transistors, while the second, fifth, sixth, and the ninth to twelfth transistors MD5, MD6 and MD9-MD12, and the body switch SWb are NMOS transistors.

In the first transistor MD1, a source is connected to the source of the first transistor MP1 of the power unit 730, and a drain is connected to a drain of the ninth transistor MD9. In the second transistor MD2, a drain is connected to the drain of the second transistor MP2 of the power unit 730, and a source is connected to a drain of the body switch SWb.

In the third transistor MD13, a source is connected to a power voltage $V_{DD}$, a drain is connected to a drain of the fourth transistor MD4, and a clock signal CK is input to a gate. In the fourth transistor MD4, a source is connected to the power voltage $V_{DD}$, the drain is connected to the drain of the third transistor MD3, and a channel selection signal SEL # is input to a gate.

In the fifth transistor MD5, a drain is connected to the drain of the third transistor MD3, a source is connected to a drain of the sixth transistor MD6, and a channel selection signal SEL # is input to a gate. In the sixth transistor MD6, the drain is connected to the source of the fifth transistor MD5, a source is connected to the drain of the second transistor MP2 of the power unit 730, and a clock signal CK is input to a gate.

In the seventh transistor MD7, a source is connected to the drain of the third transistor MD3, a drain is connected to a source of the eighth transistor MD8, and an inverted channel selection signal SELB # is input to a gate. In the eighth transistor MD8, the source is connected to the drain of the seventh transistor MD7, a drain is connected to the drain of the second transistor MP2 of the power unit 730, and an inverted clock signal CKB is input to a gate.

When the clock signal CK has a high logic value and the channel selection signal SEL # has a low logic value, the fourth transistor MD4 is turned-on and the fifth transistor MD5 and the seventh transistor MD7 are turned-off, and thus, a source-gate voltage of the first transistor MD 1 is lower than a threshold voltage. Therefore, the first transistor MD1 may be turned off.

When the clock signal CK has a low logic value and the channel selection signal SEL # has a high logic value, the third transistor MD3 is turned-on and the sixth transistor MD6 and the eighth transistor MD8 are turned-off, and thus, a source-gate voltage of the first transistor MD1 is lower than a threshold voltage. Therefore, the first transistor MD1 may be turned off.

When the clock signal CK and the channel selection signal SEL # have high logic values, the fifth to eighth transistors MD5 to MD8 are turned-on and a source-gate voltage of the first transistor MD1 is maintained at $V_{DD}$, so that the first transistor MD1 may be turned on.

In the ninth transistor MD9, the drain is connected to the drain of the first transistor MD1, a source is commonly connected to a drain of each of the tenth transistor MD10 and the eleventh transistor MD11, and the power voltage $V_{DD}$ may be applied to a gate. The tenth transistor MD10, operated according to the inverted clock signal CKB, and the eleventh transistor MD11, operated according to the inverted channel selection signal SELB #, may be connected between the ground GND and the source of the ninth transistor MD9 in parallel.

The ninth to eleventh transistors MD9 to MD11 are connected in series between a ground GND and a control terminal G of the analog switch SWa, and may be used as a control terminal grounding device of the analog switch SWa.

In the twelfth transistor MD12, a drain is connected to a body of the analog switch SWa, a source is connected to the ground GND, and an inverted clock signal CKB is input to a gate.

The analog switch SWa may sample the analog signal Ain of a specific channel input to the input terminal IN according to the bootstrap signal Sb, and output the analog signal to the output terminal OUT as Aout.

In the body switch SWb, a source is connected to a body of the analog switch SWa, the drain is connected to the source of the second transistor MD2, and a bootstrap signal Sb may be input to a gate. The body switch SWb may be operated synchronously with the analog switch SWa. The body switch SWb short-circuits a body of the analog switch SWa and the input terminal IN in the on-phase, thereby removing a body effect of the analog switch SWa.

The bootstrap circuit 700 includes the body switch SWb, thereby optimizing an on-resistance of the analog switch SWa according to a frequency of the analog signal Ain. Thus, even when a swing width of the analog signal Ain is great, linearity of the analog switch SWa may be further improved.

Hereinafter, an operation of the bootstrap circuit 700 will be described in detail with reference to the operation waveform of FIG. 8.

As a cycle of the clock signal CK is repeated, the bootstrap capacitor Cb may be charged with $V_{DD}$ by the charge pump 710.

When the clock signal CK is a high logic value, the connection of the bootstrap capacitor Cb with the charge pump 710 is blocked. Moreover, when the channel selection signal SEL # is a high logic value, the bootstrap capacitor Cb is connected to the switch driver 750.

When the clock signal CK and the channel selection signal SEL # have high logic values, the first transistor MD1 and the second transistor MD2 are turned-on, and a voltage between the input terminal IN and the control terminal G of the analog switch SWa is maintained at the constant voltage $V_{DD}$. Therefore, the analog switch SWa is turned-on. Moreover, the body switch SWb is turned-on with the analog switch SWa, thereby short-circuiting the body and the source of the analog switch SWa.

When the clock signal CK has a low logic value, the connection of the bootstrap capacitor Cb with the switch driver 750 is blocked and the bootstrap capacitor is connected to the charge pump 710. Moreover, when the channel selection signal SEL # has a low logic value, the connection of the bootstrap capacitor Cb with the switch driver 750 is blocked.

When the clock signal CK has a low logic value, the first transistor MD1 of the switch driver 750 is turned-off and the tenth transistor MD0 is turned-on, and thus, a voltage between the input terminal IN and the control terminal G of the analog switch SWa is lower than a threshold voltage. Therefore, the analog switch SWa is turned-off. Moreover, since the twelfth transistor MD12 is turned-on, the body of the analog switch SWa is connected to the ground GND.

Figure 9:
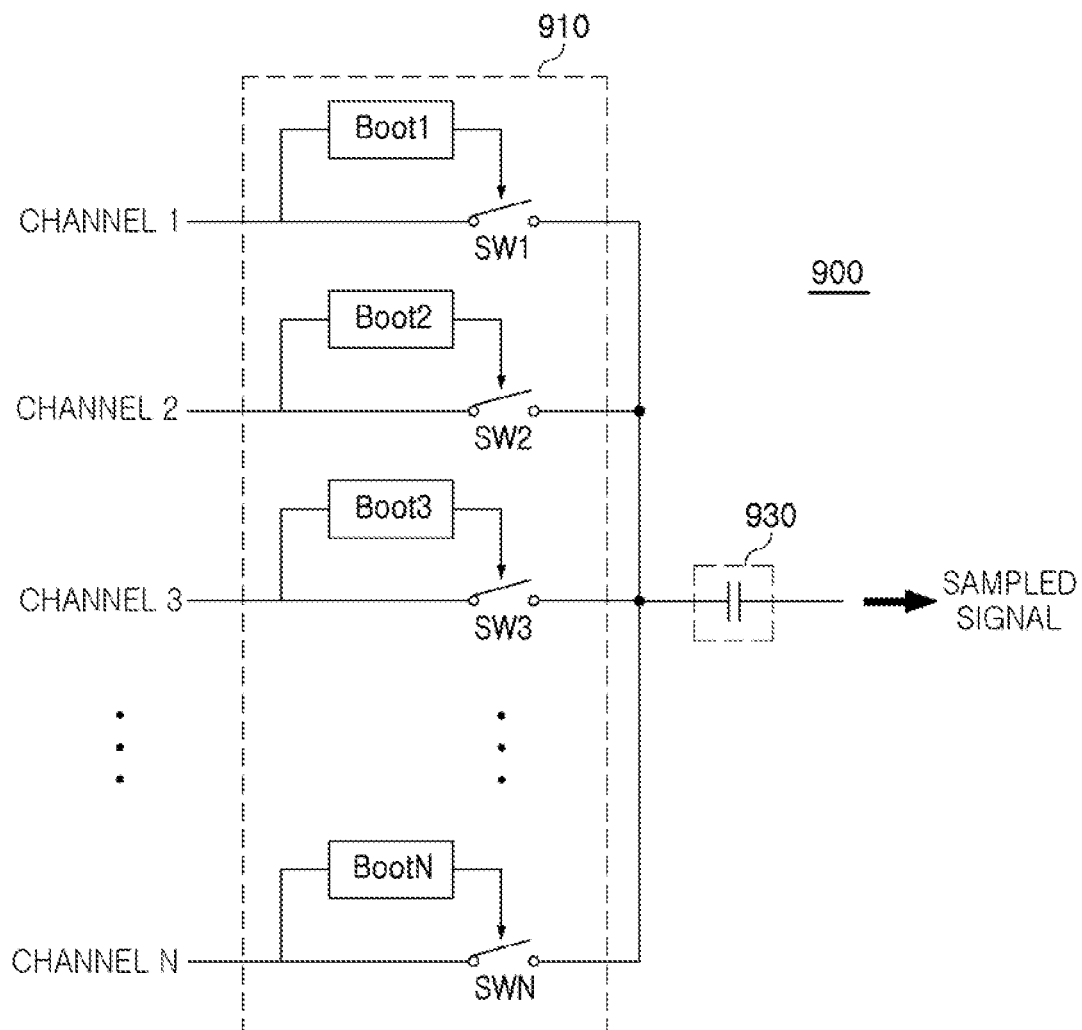
FIG. 9 is a circuit diagram illustrating a sampling circuit using a bootstrap circuit according to an exemplary embodiment of the present inventive concept.

FIG. 9 is a circuit diagram illustrating a sampling circuit using a bootstrap circuit according to an exemplary embodiment of the present inventive concept.

Referring to FIG. 9, a sampling circuit 900 may sample a plurality of analog signals, in which frequencies, amplitudes, and the like, are different. For example, the sampling circuit 900 receives multi-channel analog signals, and samples and outputs an analog signal of a specific channel.

The sampling circuit 900 may include a first analog switch terminal 910, including a total of N analog switches SW1, SW2, SW3 to SWN, and a sampling capacitor 930, in order to sample N channel analog signals, e.g., analog signals input via channel 1, channel 2, channel 3 to channel N.

Bootstrap circuits Boot1, Boot2, Boot3 to BootN, connected to respective analog switches SW to SWN, may perform a multiplexing function based on channel selection signals SEL1 to SELN. Thus, since the sampling circuit 900 does not require a separate multiplexer, a size thereof may be reduced. An example of the bootstrap circuits Boot1 to BootN is as described above with reference to FIGS. 5 to 8.

Moreover, in the bootstrap circuits Boot1 to BootN, the charge pump and the power unit are functionally separated from a switch driver using the channel selection signals SEL11 to SELN, so that the bootstrap capacitor may be charged with a constant voltage $V_{DD}$. Thus, the bootstrap circuits Boot1 to BootN may supply the constant voltage $V_{DD}$, charged in the bootstrap capacitor, to the analog switches SW1 to SWN without additional pumping time, even when a particular channel is repeatedly selected.

As set forth above, in accordance with exemplary embodiments of the present inventive concept, a bootstrap circuit includes a body switch for removing a body effect of an analog switch, thereby further improving linearity of the analog switch.

Moreover, in the bootstrap circuit, a multiplexing function using a channel selection signal is embedded therein, thereby reducing a size of an analog circuit using a bootstrap circuit.

Moreover, in a bootstrap circuit, by using a channel selection signal, a charge pump and a switch driver are separated from each other, thereby removing a repeated pumping time of the charge pump.

While the present inventive concept has been shown and described with reference to exemplary embodiments thereof, it will be apparent to those skilled in the art that modifications and variations could be made thereto without departing from the scope of the present inventive concept, as defined by the appended claims.

What is claimed is:

1. A bootstrap circuit, comprising:
   a charge pump;
   a power unit including a bootstrap capacitor, wherein the bootstrap capacitor is charged using an output voltage of the charge pump; and
   a switch driver for generating a bootstrap signal based on a clock signal and an analog signal, wherein the analog signal is input to an analog switch, the switch driver for controlling the analog switch using the bootstrap signal, and including a first body switch connected between an input terminal and a body of the analog switch.

2. The bootstrap circuit of claim 1, wherein the power unit includes:
   a first transistor having a drain connected to a power voltage, and a source connected to a first node of the bootstrap capacitor; and
   a second transistor having a drain connected to a second node of the bootstrap capacitor, and a source connected to a ground.

3. The bootstrap circuit of claim 1, wherein the first body switch operates synchronously with the analog switch in response to the bootstrap signal.

4. The bootstrap circuit of claim 1, wherein the switch driver further includes a second body switch connected between an input terminal and a body of the first body switch.

5. The bootstrap circuit of claim 1, wherein the switch driver includes:

a first transistor having a source connected to a first node of the bootstrap capacitor and a drain connected to a control terminal of the analog switch; and a second transistor having a source connected to a source of the analog switch and a drain connected to a second node of the bootstrap capacitor.

6. The bootstrap circuit of claim 5, wherein a voltage, charged in the bootstrap capacitor, is supplied to the analog switch, when the first transistor and the second transistor are turned on.

7. The bootstrap circuit of claim 5, wherein the switch driver further includes:

a third transistor connected between a power voltage and a gate of the first transistor; and a fourth transistor and a fifth transistor, connected between the gate of the first transistor and the drain of the second transistor in parallel.

8. The bootstrap circuit of claim 7, wherein the third transistor operates synchronously with the first transistor in response to the clock signal.

9. The bootstrap circuit of claim 7, wherein the third transistor is operated alternately with the fourth and fifth transistors.

10. A bootstrap circuit, comprising:

a power unit including a bootstrap capacitor, wherein the power unit charges the bootstrap capacitor using an output voltage of a charge pump; and a switch driver for supplying a voltage charged in the bootstrap capacitor to an analog switch in response to a clock signal and a channel selection signal, and including a first body switch connected between an input terminal and a body of the analog switch.

11. The bootstrap circuit of claim 10, wherein the switch driver is connected to the bootstrap capacitor to drive the analog switch when the clock signal and the channel selection signal are both high logic values.

12. The bootstrap circuit of claim 10, wherein the switch driver further includes: a second body switch connected between an input terminal and a body of the first body switch.

13. The bootstrap circuit of claim 10, wherein the switch driver includes:

a first transistor having a source connected to a first node of the bootstrap capacitor and a drain connected to a control terminal of the analog switch; and a second transistor having a source connected to a source of the analog switch and a drain connected to a second node of the bootstrap capacitor.

14. The bootstrap circuit of claim 13, wherein the switch driver further includes:

third and fourth transistors connected to each other in parallel between a power voltage and a gate of the first transistor;

fifth and sixth transistors connected in series between the gate of the first transistor and the drain of the second transistor; and seventh and eighth transistors connected to the fifth and sixth transistors in parallel.

15. The bootstrap circuit of claim 14, wherein the first transistor is turned-off, when at least one of the clock signal and the channel selection signal has a low logic value.

16. The bootstrap circuit of claim 13, wherein the switch driver further includes ninth, tenth and eleventh transistors connected between the control terminal of the analog switch and ground, the tenth and eleventh transistors are connected to each other in parallel, and the ninth transistor is connected in series to the tenth and eleventh transistors.

17. The bootstrap circuit of claim 13, wherein the switch driver further includes a twelfth transistor connected between the body of the analog switch and ground.

18. A sampling circuit, comprising:

a plurality of analog switches for sampling a plurality of analog signals; and a bootstrap circuit connected to each of the plurality of analog switches, wherein a first bootstrap circuit of the bootstrap circuits includes:

a power unit including a bootstrap capacitor, wherein the power unit charges the bootstrap capacitor using an output voltage of a charge pump; and a switch driver for supplying a voltage charged in the bootstrap capacitor to a first analog switch of the analog switches in response to a clock signal and a channel selection signal, and including a first body switch connected between an input terminal and a body of the first analog switch.

19. The sampling circuit of claim 18, wherein the switch driver further includes a second body switch connected between an input terminal and a body of the first body switch.

20. The sampling circuit of claim 18, wherein the switch driver is connected to the bootstrap capacitor to drive the first analog switch, when the clock signal and the channel selection signal are both high logic values.

* * * * *